United States Patent [19]
Altekrüger et al.

[11] Patent Number: 5,485,802
[45] Date of Patent: Jan. 23, 1996

[54] METHOD AND APPARATUS FOR PULLING MONOCRYSTALS FROM A MELT

[75] Inventors: Burkhard Altekrüger, Alzenau; Roland Gesche, Seligenstadt; Martin Flachsel, Bad Vilbel; Joachim Aufreiter, Alzenau, all of Germany

[73] Assignee: Leybold Aktiengesellschaft, Hanau, Germany

[21] Appl. No.: 183,005

[22] Filed: Jan. 18, 1994

[30] Foreign Application Priority Data

Jan. 16, 1993 [DE] Germany .......................... 43 01 072.5

[51] Int. Cl.⁶ ..................................................... C30B 15/20
[52] U.S. Cl. .................... 117/14; 117/18; 117/214
[58] Field of Search ........................ 117/14, 18, 34, 117/201, 204, 213, 214, 216, 217, 904; 356/384; 414/217

[56] References Cited

U.S. PATENT DOCUMENTS

| | | | |
|---|---|---|---|
| 4,282,184 | 8/1981 | Fiegl et al. | 422/106 |
| 4,710,258 | 12/1987 | Latka | 117/202 |
| 4,832,496 | 5/1989 | Thomas | 356/384 |
| 4,904,143 | 2/1990 | Drechsel et al. | 414/217 |
| 5,089,238 | 2/1992 | Araki et al. | 117/202 |
| 5,096,677 | 3/1992 | Katsuoka et al. | 117/217 |
| 5,180,562 | 1/1993 | Drechsel et al. | 422/429 |
| 5,288,363 | 2/1994 | Araki | 117/15 |
| 5,292,486 | 3/1994 | Drechsel | 422/249 |

FOREIGN PATENT DOCUMENTS

| | | |
|---|---|---|
| 997255 | 9/1976 | Canada . |
| 170856 | 2/1986 | European Pat. Off. . |
| 499220 | 2/1992 | European Pat. Off. . |
| 3904858 | 2/1989 | Germany . |
| 2208280 | 2/1989 | Japan . |
| 4264091 | 3/1990 | Japan . |
| 4260688 | 2/1991 | Japan . |
| 599403 | 3/1980 | U.S.S.R. . |
| 968106 | 10/1982 | U.S.S.R. . |
| 1700112 | 12/1991 | U.S.S.R. . |

OTHER PUBLICATIONS

Mahyon et al., Neural Network and Fuzzy Models For Real Time Control of a CVD Epitacral Reactor, Proc. SPIE–Int. Soc. Opt. Eng. (1992).

*Primary Examiner*—Robert Kunemund
*Assistant Examiner*—Felisa Garrett
*Attorney, Agent, or Firm*—Felfe & Lynch

[57] ABSTRACT

A crucible is situated in a vacuum chamber and provided with a feeder for granulate material, heating elements for melting the material, and a crystal puller above the crucible. Measuring elements provide signals for a controller including a fuzzy processor utilizing an empirically determined data field to output a signal for the material feeder.

12 Claims, 3 Drawing Sheets

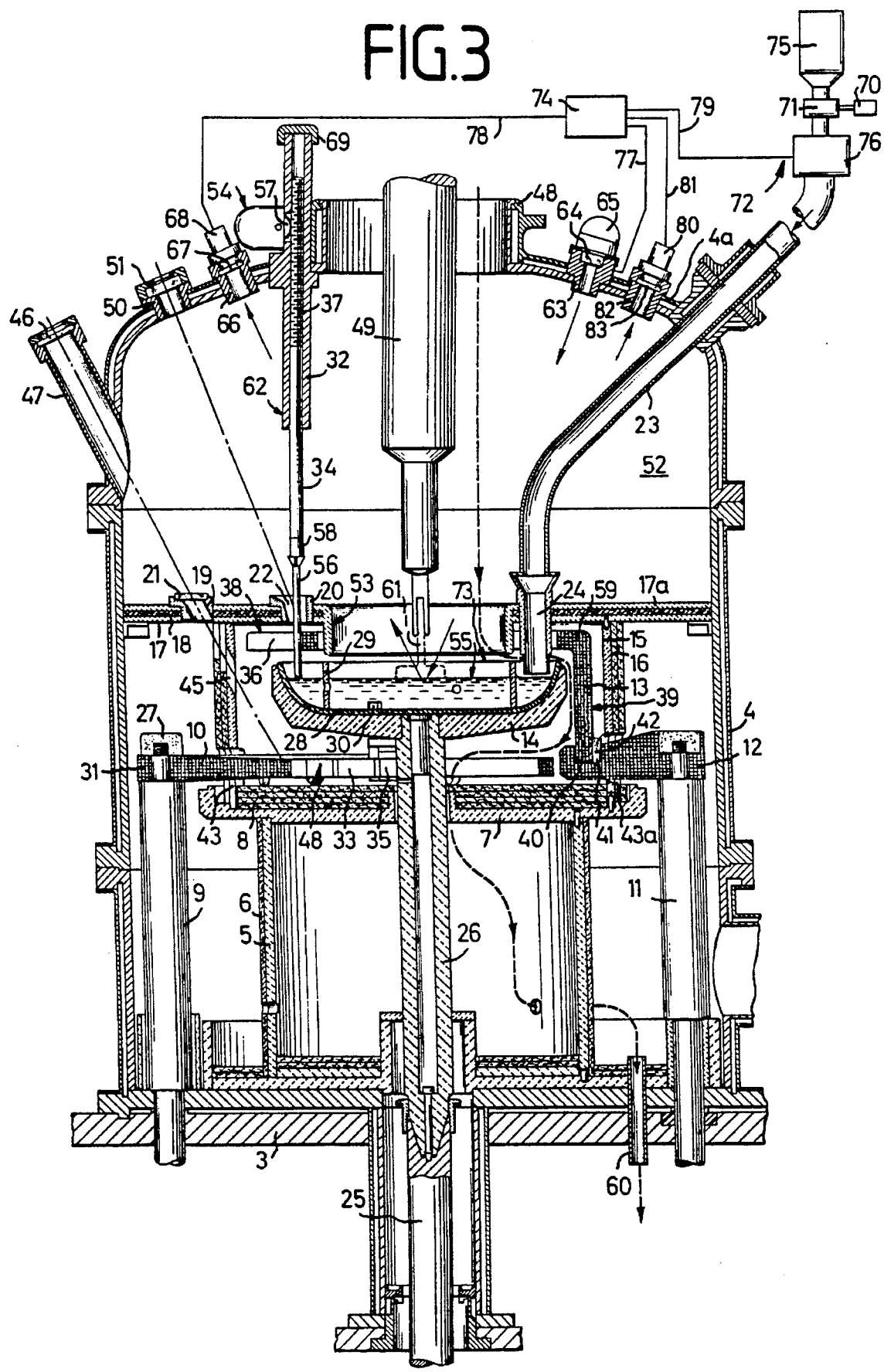

METHOD AND APPARATUS FOR PULLING MONOCRYSTALS FROM A MELT

BACKGROUND OF THE INVENTION

The invention relates to a method and an apparatus for pulling monocrystals from a melt under vacuum or under inert gas with an apparatus having a crucible which is disposed in a vacuum chamber and heated by the thermal radiation of heating elements. A pulling device is provided above the melt situated in the crucible, by which the monocrystal can be pulled upward out of the melt surface. A feeding device is provided whose filler opening terminates above the crucible and through which the charge material can be added to the crucible by a conveyor during the pulling process. Measuring sensors continually provide the characteristic parameters of the crystal pulling process into a controller which controls the conveyor.

Canadian Patent No. 997,255 discloses an apparatus for pulling crystals out of a melt, having an optical device for monitoring and/or controlling the diameter of the growing portion of the crystal. The optical device contains photoelectric cells whose signals are entered via amplifiers into a PID controller, which in turn is connected to a high-frequency generator which serves as a power control and which also supplies the current for the heating coil placed around the melting crucible. The level of the molten bath is used in this device as a factor for controlling the heating current.

Also known is a method and a system for monitoring and controlling crystal growing processes (DD 253,437) in which the temperature pattern as well as temperature variations in the vicinity of the solidification front are measured so that a corresponding correction can be made after comparison with a temperature pattern that is typical for the crystal growing process involved. The thermal radiation emitted by a crystal growing out of a melt and that emitted by the melt itself are sensed by means of a linear or broad-surface arrangement of photosensors consisting of at least two spatially separate individual elements, and difference signals are formed whose magnitude is proportional to the temperature change in the defined area, thereby detecting temperature patterns which are constantly brought into agreement with the predefined temperature pattern.

A computer permits the correction of the nonlinear relationship between temperature and the magnitude of the signal, so that an actual temperature corresponds to the value of each signal.

U.S. Pat. No. 4,832,496 discloses a measuring method and a measuring system for the diameter of monocrystals being pulled from a crucible, in which use is made of an optical detection of the brightness profile at the point of transition from the melt to the monocrystal, and of a reading of the position of the brightness profile in relation to a point of reference on a display. The images of the melt/monocrystal transition or its intensity signals are connected to an evaluation circuit for measuring the diameter, and by means of these produce an effect on the pulling parameters, i.e., for example, quantitatively the level of the melt in the crucible, or qualitatively the melting of the starting material which is in granular or lump form.

These known evaluating circuits, however, are not satisfactory in practice, since the pulling process is extremely complex overall, and also depends on a series of effects and data determined by experience, which cannot be processed correctly or fast enough by the former control circuits, since they do not correspond to numerical equations or classical mathematical logic or often are based on ambiguous readings.

SUMMARY OF THE INVENTION

The present invention is addressed to overseeing crystal growing processes which will take into account great, sometimes unwanted complex and nonlinear interactions in the process among process parameters which are at first controlled independently of one another. In particular the apparatus and the method are to control the vibrator of the feeder apparatus such that the temperature of the molten bath and the level of the melt will be kept constant within very narrow limits, so that the crystal grows out of the melt in a completely uniform and constant manner.

According to the invention, the data of the crystal pulling process obtained by means of the sensors or measuring instruments, such as the level of the molten bath and the melt temperature, are continuously fed as input signals to the controller, in which a fuzzy processor is implemented which puts out the signal for operating the conveyor along a control structure making allowance for empirically learned data.

BRIEF DESCRIPTION OF THE DRAWINGS

FIG. 3 is a longitudinal section of a crystal pulling apparatus in which the control circuit of FIG. 1 is used, and in which the two parameters, melt bath level and melt bath temperature, are determined by a position measuring system and a pyrometer.

DETAILED DESCRIPTION OF THE PREFERRED EMBODIMENT

Figure 1:
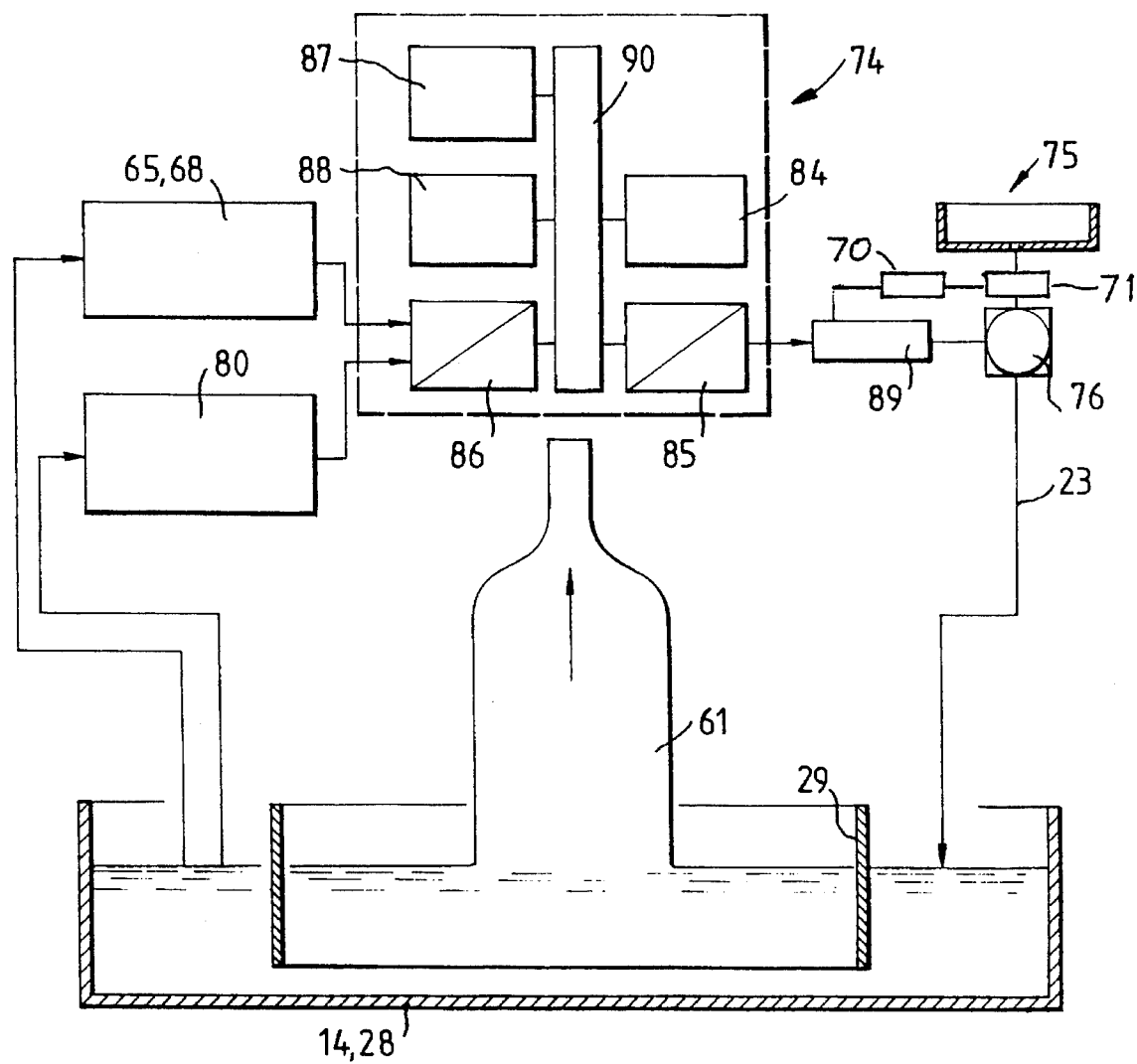
FIG. 1 is the block circuit diagram of a feeding system with a control circuit in the form of a fuzzy control.

Referring to FIG. 3, the crystal pulling apparatus consists essentially of a double-walled tank 4 which is set up on the likewise double-walled tank bottom plate 3 of the frame of the apparatus, and which forms a vacuum chamber 52. A supporting tube is 5 disposed in the tank 4 and mounted on the tank bottom plate 3 with a thermal insulation 6 surrounding it, an annular pan 7 being held by the supporting tube 5 and containing graphite felt plates 8. Two power feeders 9 are held on the tank bottom plate 3 for a bottom heater 10 held above the pan 7, two additional power feeders 11 are held in the tank bottom plate 3 and have clamping jaws 12 screwed to each of them which in turn bear a top heater 13. A melting crucible 14 is surrounded by a tubular radiation shield 15 supported on the pan 7 and having lateral thermal insulation 16. A cover plate 17 borne by the tubular radiation shield 15 includes an upper face-end thermal insulation 18 and a top plate 17*a*. A through-passage 19 with a glass lens 21, a sleeve 20, a charge replenishing tube 23, and a funnel 24 pass through the cover plate 17, 17*a*, 18. A rotatable crucible shaft 25 holds the crucible supporting shaft 26 upon which the crucible 14 and crucible insert 28 are mounted.

The bottom heater 10 held by the two power feeders 9 consists of two heater shanks 31 and the two heating coils 33 (of which only one is shown) of zig-zag shape connected with them. The heating coils 33 together form an opening in the center of the bottom heater 10, through which the crucible supporting shaft passes. The top heater 13 is formed by a circular, flat portion 38 provided with radial slots 36, and a hollow cylindrical side portion 39. The hollow cylindrical portion 39 is provided on two opposite portions with heater legs 40 reaching downward, engaging each in pockets 41 which are provided in the two clamping jaws 12 held by the power feeders 11. In order to assure a reliable transfer of power to the two pockets 41 holding the clamping jaws 12, additional wedges 42 are driven into the trapezoidal pockets 41.

The radiation shield tube 15 has four rectangular openings 43, 43a, . . . distributed uniformly on the circumference of the radiation shield tube 15 and arranged on its bottom margin. The heater shanks 31 of the bottom heater 10 on the one hand, and on the other hand the clamping jaws 12, are brought through these openings 43, 43a, . . . Furthermore, the radiation shield tube 15 is provided with a slanting bore 45 which is in line with the glass lens 21 in the cover plate 17, 17a and the lens 46 of the tube 47 fastened in the wall of the tank 4. Additional openings in the side wall of the radiation shield tube 15 permit the unhampered passage of gas from the upper section of the interior of the tank 4 into the lower section. The tank 4 is furthermore provided in the area of its cover portion 4a with a collar 48 which permits the entry of the pulling means 49. Also, in the cover portion 4a of the tank 4 there is provided a second connection 50 with an inspection glass 51, a third connection 63 with a lens 64 and a fourth connection 82 with a lens 83 and a signal emitting pyrometer signal emitter 80.

The bottom heater 10, which is slotted to form a serpentine pattern, is fastened to the two power feeders 9 by graphite nuts 27. The purpose of the bottom heater 10 is to heat the crucible 14, 28 and the melt from the bottom side. The top heater 13 improves the melting of the charge material. The top heater 13 in the case of a silicon melt can be coated or shielded with silicon carbide so as to prevent graphite particles from falling into the melt resulting in carbon contamination. The broken line indicates a stream of argon gas which can be guided through the collar 48, through the central opening 53, over the melt and around the crucible 14 and can be carried downward through the slots in the bottom heater 10, and exit through the pipe 60. In the center of the heating system is the graphite crucible 14 into which is inserted the liner 28 which is formed from a material that does not react with the melt.

To assure that the bath will remain quiet when it is replenished during the pulling process, an additional ring 29, which is also formed of a material that does not react with the melt, is inserted into the crucible 28. In the ring 29 openings 30 are situated at its bottom end, through which the melted charge material can flow into the center of the crucible insert 28.

Around the two heaters 10 and 13 there is provided a thermal insulation 8, 16, 18 which consists of graphite felt plates 8 mounted in the pan 7, a lateral thermal insulation 16 which is in the form of a cylinder and placed over the radiation shield tube 15, and an upper, ring-shaped thermal insulation 18. The upper covering plates 17 and 17a are supported, together with the thermal insulation 18, on the cylindrical inside surface of the tank 4. Additional details of the above described melting apparatus may be found in U.S. Pat. No. 5,180,562.

On the cover 4a of the tank 4, beside the collar 48 for the introduction of the pulling means 49, there is fastened a guiding tube 32 in which a rod 34 is mounted for longitudinal displacement, the upper end of which is a threaded spindle 37 engaged by a drive shaft 57 which in turn can be driven by a gear-motor unit 54. The crucible end (lower end) of the rod 34 is provided with a chuck 58 in which a thin rod 56 of a highly doped material is held in line with the opening 22 in the guide 20 and with the slot 36. To be able to keep the composition of the melt constant, the highly doped thin rod 56 can be lowered or raised perpendicularly by means of the gear-motor unit 54. When the thin rod 56 is dipped into the molten bath, the immersed end of the thin rod 56 is melted away, so that the composition of the melt can be regulated and kept constant.

The level of the melt in the crucible insert 28 is monitored by a signal generator 65 (of a laser light source) which is placed on the connection 63 with lens 64 and whose measuring beam (laser beam) is aimed at the melt surface 55. The reflection of the measuring beam (laser beam) is then received by the pulse detector 68 (laser light receiver) which is placed on the connection 66, and it is evaluated in the electrical circuit or controller 74 (a device for monitoring the level of a molten bath is further described in DE 39 04 858). Also, the signals from the pyrometer 80 which is held by the connection 82 with lens 83 are fed through the signal conductor for evaluation in the controller 74. The apparatus can produce signals which correspond to the momentary melt level and the momentary melt temperature and feed them to a controller 74, which in turn regulates the granulate feeder 76.

The replenishment of the material for melting is performed via the feed tube 23 and the funnel 24 from the replenishing apparatus 72 so that the melt level is kept as constant as possible. To achieve this constancy, the replenishing apparatus 72 operates in accordance with electrical input signals emitted by the programmed controller 74. The charge replenishing apparatus includes an upper container 75 in which the material is in granular form, a lower container or granulate feeder 76 with a shaker system or a conveyor by which the charge material is introduced into the feed tube 23, and an airlock 71 and its corresponding actuator 70 which are inserted into a section of tubing that connects the two containers 75 and 76 to one another. A replenishing apparatus of the type in question is described in U.S. Pat. No. 4,904,143.

Referring to FIG. 1, the controller 74 takes into account not only the parameters bath temperature and bath level detected by the two sensors 68 and 80, but also elements which include intuition and empirical knowledge. While the controllers used heretofore had to be recalibrated whenever the working point shifted during operation, the controller 74 makes possible a "feed-forward" process and assumes in this sense the functions of an experienced operator of the system. The program controller 74 is a fuzzy controller which includes human experience and the feed-forward concept and thus improves the quality of the crystal and on the other hand renders the experienced operator superfluous.

Figure 2:
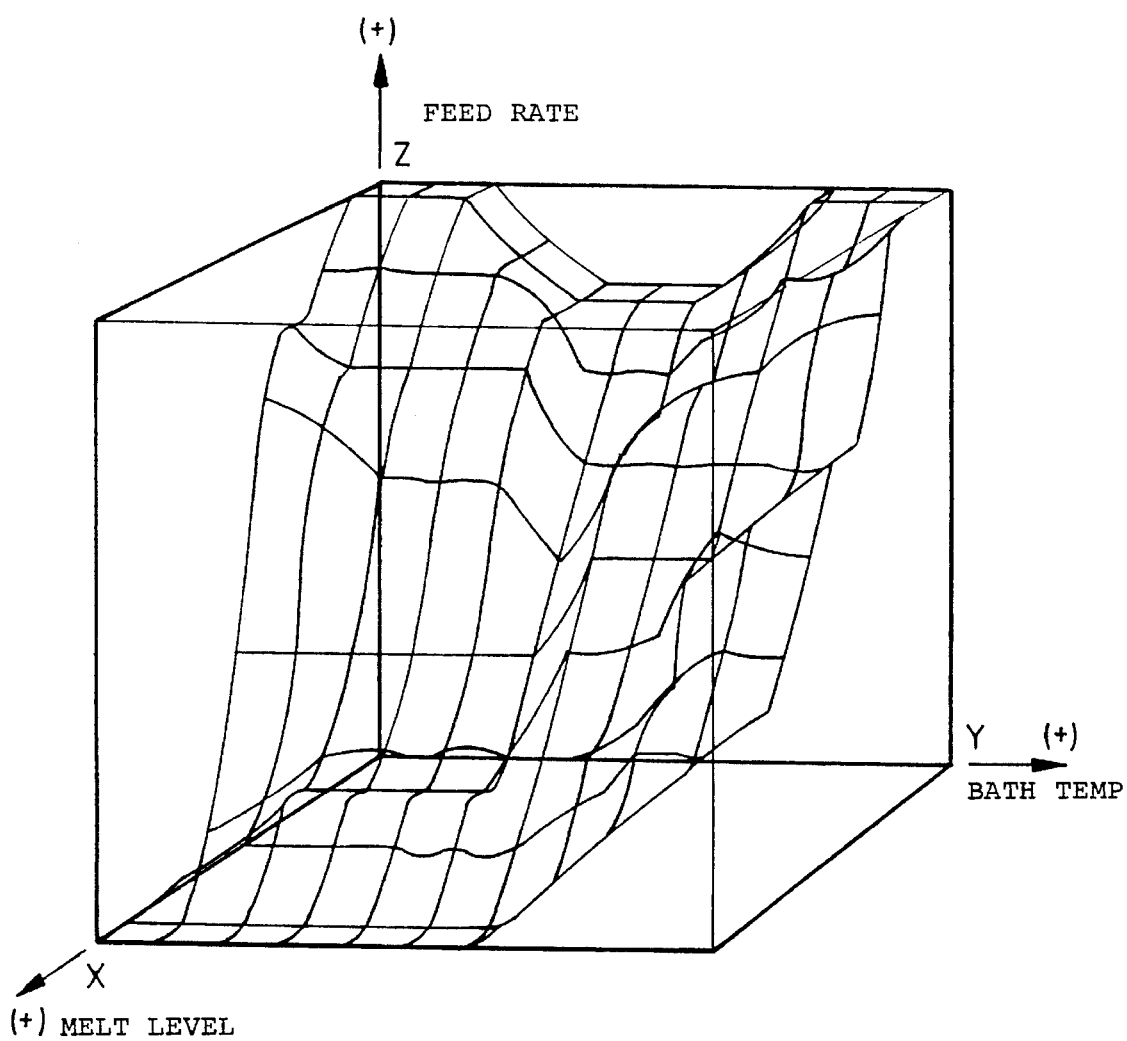
FIG. 2 represents a set of curves typical of the control circuit of FIG. 1.

More particularly, the fuzzy processor utilizes a field of empirically learned data to determine a desired output from measured inputs. For example, the parameters melt level, bath temperature, and granulate feed rate may be correlated by testing to determine the ideal feed rate for every melt level and bath temperature; the ideal feed rate would be that which results in the desired uniformity of the crystal being pulled. FIG. 2 shows such an empirically learned data field as a three dimensional surface representing the three mentioned parameters. When used by the fuzzy processor, the inputs melt level and bath temperature are plotted on the surface to determine the correct feed rate for the desired crystal properties.

The outstanding conditions for a maximum quality of the crystal are:

An absolutely uniform crystal pulling rate,
an absolutely constant melt bath temperature, and
an absolutely uniform melt bath level.

These conditions can be achieved essentially only if the replenishing apparatus 72 always adds only as much granulate from the upper container 75 as the growing crystal has just withdrawn from the melt bath 55. A practical difficulty is only that the granulate added affects the bath temperature, i.e., the bath temperature lowers after a replenishment and it takes a certain amount of time before the set temperature is reestablished. The graph represented in FIG. 2 on which the controller 74 operates is so constructed that in very minimal steps only just enough granulate is added that no substantial temperature drop adverse to the pulling process can occur. In this case the bath level is plotted on the x-axis, the bath temperature on the y-axis, and the rate of replenishing on the z-axis. Since the rate of advancement is to be kept as constant as possible, an actuator 70 for actuating the airlock 71 only in large steps of "fully on" and "fully off" is not suitable, since it would result in a process that would be subject to great "swings," so that the crystal would grow irregularly. As the graph in FIG. 2 shows, setting out from an "ideal state" (situated, say, in the center of the graph), if a temperature rise occurs an increase in the replenishing rate would result, and the same would happen if the bath level drops; on the other hand, the replenishing rate will decrease if the temperature decreases and if the bath level rises. The controller 74 is equipped with a fuzzy logic $3/86$ DX processor of the firm of Inform of Aachen (for such applications a great number of fuzzy processors are available on the market, e.g., the Togai FC $^{110}/_3$ or the Omron EP-$^{3000}/_4$). The temperature sensor 80 is a bicolor pyrometer (of the firm of Ircon) and the beam source 65 is a laser (of the firm of Ibel). As FIG. 3 shows, the data measured by the sensors 80 and 68 enter into the controller 74 via the signal lines 77, 78 and 81, the shaker or conveyor 76 being started via the signal line 79. As FIG. 1 shows, the controller 74 consists of a data bus 90 linking together, in a known manner, the analog-digital converters 85, 86, the microprocessor 87 the controller memory 88, and the fuzzy processor 84. The AD output converter 85 operates the actuator 89, which in turn operates the granulate feeder 76 and the actuator 70 for the airlock 71.

Years of observation have shown that process stability can be achieved only if all control circuits of a crystal apparatus are tied together in several planes to form a hierarchical control structure.

Essentially, they are the following control modes:
Heater power—Voltage of the power supply
Heater temperature—Heater power
Melt temperature—Heater temperature
Rate of growth—Heater temperature
Average pulling rate—Heater temperature
Crystal diameter—Pulling rate
Level of melt—Granulate feeder The above-described apparatus relates only to the last-named control circuit, although it is true accordingly of all other control circuits that interactions clearly exist between the individual parameters, so that the corresponding input signals can be processed through a fuzzy-logic processor.

In the above-described control circuit (bath-level/feeder) the following chain of causality exists for the crystal growth:
a) During the pulling process a slight but measurable lowering of the level of the melt occurs.
b) Thus, a difference between the set level of the bath (L) and its actual value occurs, and the bath level controller reacts with a corresponding change in the size of the adjustment (operation of the feeder F).
c) The difference between the bath levels is compensated by a higher feed rate of the feeder (which also corresponds to the desired operation of the level control circuit).
d) In addition, however, an undesirable effect on the temperature equilibrium occurs if the increased rate of feed of unmelted granulate causes a cooling of the outside melt in the heating zone, which then
e) due to the thermal coupling of the heating zones can affect the inner heating zone where under certain circumstances it causes an intensified crystal growth on account of the slightly cooler bath temperature.
f) This leads to an increase in the diameter of the growing crystal, which is compensated by the diameter control by increasing the pulling rate.
g) The average pulling rate increase due to the cooler bath temperature in the inner heating zone is compensated meantime by an increase in the heater power. If the process conditions are unfavorable or the controller setting is inappropriate through the system, the entire system can begin undesirable fluctuations.

According to the invention, therefore, a linking of level control and temperature control is provided, which operates on the principle of a fuzzy control structure. The reaction of the control circuits coupled in the manner described is soft and flexible. Both the slow "drifting off" of individual parameters as well as the occurrence of poorly controllable fluctuations are prevented in the manner described.

Note that the three dimensional example of FIG. 2 is just an example; the principles of the invention may be used with an empirically determined n-dimensional data field using additional factors mentioned above, e.g. crystal pulling rate and heater power. Likewise, the three dimensional field could utilize different parameters than those in the example.

The foregoing is exemplary and not intended to limit the scope of the claims which follow.

We claim:

1. Method for pulling monocrystal from a melt, said method comprising providing a crucible, feeding material to be melted to said crucible, heating said material in said crucible to form a bath of molten material, pulling said molten material from said crucible to form a monocrystal, providing an empirically determined data field including at least two parameters from a first group and at least one parameter from a second group, said first group comprising bath temperature, bath level, and crystal diameter, said second group comprising material feed rate, pulling rate, and heater power, measuring said at least two parameters from said first group, and controlling said at least one parameter from said second group by means of a fuzzy processor so that said at least two measured parameters from said first group and said at least one parameter from said second group conform to said empirically determined data field.

2. Method as in claim 1 wherein said second group comprises said feed rate.

3. Method as in claim 1 wherein said empirically determined data field comprises three parameters.

4. Method as in claim 3 wherein said empirically determined data field comprises bath level, bath temperature, and material feed rate.

5. Method as in claim 4 wherein said empirically determined data field further comprises crystal diameter and pulling rate.

6. Method as in claim 4 wherein said empirically determined data field further comprises heater power.

7. Method as in claim 1 wherein said empirically determined data field consists of three parameters, whereby said data field can be represented as a surface in three dimensional space.

8. Method as in claim 7 wherein said data field consists of bath level, bath temperature, and material feed rate.

9. Apparatus for pulling monocrystal from a bath of molten material, said apparatus comprising a crucible, feed means for feeding material to be melted to said crucible, heating means for melting said material in said crucible to form a bath of molten material, pulling means for pulling said molten material from said crucible to form a monocrystal, memory means containing an empirically determined data field including at least one parameter from a first group and at least one parameter from a second group, said first group comprising bath temperature, bath level, and crystal diameter, said second group comprising material feed rate, pulling rate, and heater power, measuring means for measuring said at least one parameter from said first group, and fuzzy processing means for controlling said at least one parameter from said second group so that said at least one measured parameter from said first group and said at least one parameter from said second group conform to said empirically determined data field.

10. Apparatus as in claim 9 wherein said empirically determined data field comprises said material feed rate.

11. Apparatus as in claim 9 wherein said empirically determined data field comprises three parameters.

12. Apparatus as in claim 11 wherein said empirically determined data field comprises bath level, bath temperature, and material feed rate.

* * * * *